(12) United States Patent
Goldrian

(10) Patent No.: US 6,633,991 B1
(45) Date of Patent: Oct. 14, 2003

(54) METHOD OF SWITCHING BETWEEN A FIRST AND SECOND CLOCK SIGNAL BY ESTABLISHING A TRIGGER TIME IN WHICH BOTH SIGNALS ARE CONSIDERED TO BE SUBSTANTIALLY IN-PHASE

(75) Inventor: Gottfried Andreas Goldrian, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/572,170

(22) Filed: May 17, 2000

(30) Foreign Application Priority Data

May 18, 1999 (EP) ............................................. 99109744

(51) Int. Cl.[7] ................................................. G06F 1/12
(52) U.S. Cl. ...................... 713/400; 713/500; 713/502; 370/352; 714/55; 714/707; 714/744
(58) Field of Search ................................. 713/400, 500, 713/502; 370/352; 714/55, 707, 744

(56) References Cited

U.S. PATENT DOCUMENTS

| | | | | |
|---|---|---|---|---|
| 4,319,276 A | * | 3/1982 | Cense et al. ................. 348/544 |
| 4,352,195 A | * | 9/1982 | Dautremay et al. ......... 375/376 |
| 4,667,320 A | * | 5/1987 | Onno et al. .................. 370/380 |
| 4,751,469 A | * | 6/1988 | Nakagawa et al. ............. 327/7 |
| 5,623,223 A | * | 4/1997 | Pasqualini ................... 327/298 |
| 5,852,728 A | * | 12/1998 | Matsuda et al. ............. 713/501 |
| 6,472,946 B2 | * | 10/2002 | Takagi ......................... 332/109 |

* cited by examiner

Primary Examiner—Thomas Lee
Assistant Examiner—Michael Nieves
(74) Attorney, Agent, or Firm—Derek S. Jennings; Anne V. Dougherty

(57) ABSTRACT

A system and method for observing the two clocking phase signals, finding a point in time when said signals have a phase coincidence which is good enough for fulfilling a phase difference requirement (e.g. 20 ps), and switching from one clock source to the other. The essential idea is not to compare the phases directly but to generate an auxiliary signal out of the two clock signals which is easier to handle in order to find that desired point in time and which reflects all desired properties of the time dependent phase shift between said clock signals. At a predetermined location in the cycle of both clock signals (e.g. its positive transition) a pulse is generated out of each of the clock signals with matched identical delay elements located very close to each other on the same chip for both signals. As they match they produce exactly the same pulse widths. The absolute length of the pulse width is of minor relevance as long as the length of the pulses is the same within close limits. Both signals are ANDed. Thus, in the resulting signal a pulse emerge at every positive transition of the oscillator clocks when the phase alignment of the clock signals is closer than the width of the transition pulse. When the alignment is bad—no signal will be produced.

15 Claims, 4 Drawing Sheets

METHOD OF SWITCHING BETWEEN A FIRST AND SECOND CLOCK SIGNAL BY ESTABLISHING A TRIGGER TIME IN WHICH BOTH SIGNALS ARE CONSIDERED TO BE SUBSTANTIALLY IN-PHASE

FIELD OF THE INVENTION

The invention relates generally to system clocking in computer systems, particularly it relates to system clocking in connected network computer systems with an enhanced degree of performance and reliability. Even more particularly, it relates to a method for hot-switching, i.e., hot-plugging between a first and a second clock signal used to supply a computer system with clock information, in which said second signal is a stand-by signal for said computer system.

BACKGROUND OF THE INVENTION

The present invention has a broad field of application, which includes any computer system having an operating clock and any requirement for hot-switching to a second clock supply in case of a failure or just a recognizable trend to a failure or insufficient operation of any piece of software or hardware being used to supply the first clock. Thus it can be applied in a large range of computer systems from a single stand-alone PC, or any computing device being even smaller than a PC to larger systems, in particular mainframe systems and even more particularly to a high-end system of inter-connected high-performance integrated system clusters in which each cluster comprises a plurality of central electronic complexes further referred to herein as CEC, e.g., some arrangement of high performance mainframe computer and its associated environment.

The present invention will be described with particular respect to such high-end systems which need such characterizing features, although its scope is as indicated above. In such high-end systems, the application work is distributed all over the plurality of CECs in multiple clusters. For achieving good performance the clusters are connected via high-speed optical fiber cables.

Especially in highly sophisticated applications running in such systems, which applications have a great need for system stability and reliability (like banking applications and the like), a proper operation of such a clustered application needs precisely synchronized and reliably supplied time information in order to have the same time base everywhere in the plurality of clusters. In spite of enhanced security requirements the essential system resources (like e.g. the clocking information) of such systems are provided redundantly.

Such a system is described with its requirements concerning the time facility in IBM Journal Of Research and Development, Vol.36, No.4, July 1992, p. 658. Here it is expressed that such a tough requirement of system availability implies that the possibility to maintain a plurality of 'distributed' time sources in each CEC, for example, is excluded. Thus, one central time information supplier is needed for the whole system.

As indicated above some degree of clock supplier failure safety is required. Thus, at least two redundant time information suppliers, further exemplarily referred to herein as Sysplex Timers (ST) as they are called in IBM S/390 systems are required. Each ST is in turn connected with an external absolute time source further referred to as ETS, such as Global Positioning System (GPS) time source or the like. Said two STs are connected with the system via particular, dedicated high speed cables. Such a type of system is depicted in FIG. 1 where two clusters are depicted, each with a respective ST. To a given time only one of said time sources supplies the plurality of CECs with time information. Time information is synchronized between the two time sources with a dedicated time information line, again. On a failure in said 'active' time source the other (i.e., stand-by time source) replaces the operation of the first.

The most critical apparatus in the clock supply chain is often a transceiver which converts optical signals into electrical signals. Such transceiver element is not depicted explicitly in FIG. 1 but can be considered as part of said ISC links 18. The oscillators themselves are quite failure safe compared to the transceivers. The present invention's concept can be applied particularly in systems like that shown in FIG. 1 when any element in said supply chain—particularly said transceiver—should fail, but the clock signals are still detectable upstream of said element which failed. Such an interruption of system operation should be avoided for a variety of reasons.

The most important obstacle on the way to hot-switching systems from one clocking source to any stand-by clocking source is that a proper switching requires nearly a perfect phase coincidence in both clock signals having freely moving phase fronts relative to one another. Such tough requirements exist due to sensitive PLL circuits arranged for generating the desired system clock of several 100 Mhz. Sensitive PLL circuits need an accuracy of about 20 picoseconds in phase coincidence. Such an accuracy, however, could not be achieved until now as the simplest logic comprising an AND or an OR gate will generate a delay of already nearly 100 pico seconds.

It is thus the object of the present invention, to overcome these difficulties and to provide a method and system for switching between two high frequency signals, in particular between two high frequency clocking sources which are able to meet said tough requirements of phase coincidence mentioned above.

SUMMARY OF THE INVENTION

The foregoing and other objects of the invention are achieved by the features stated in enclosed independent claims. Further advantageous arrangements and embodiments of the invention are set forth in the respective subclaims.

The basic idea comprising the present invention is to observe the two clocking phase signals and find out a point in time when said signals have a phase coincidence which is good enough for fulfilling said requirement of e.g. 20 ps phase difference—and then switch from one clock source to the other. The essential idea is not to compare the phases directly but to generate an auxiliary signal out of the two clock signals which is easier to handle in order to find that desired point in time and which reflects all desired properties of the time dependent phase shift between said clock signals.

The auxiliary 'phase detector' signal is generated as follows: at a predetermined location in the cycle of both clock signals (e.g. at its positive transition) a pulse is generated out of each of the clock signals with matched identical delay elements located very close to each other on the same chip for both signals. As they match they produce exactly the same pulse widths. The absolute length of the pulse width is of minor relevance as long as the length of the pulses is the same within close limits. Both signals are ANDed. Thus, in the resulting signal a pulse emerges at every positive transition of the oscillator clocks when the phase alignment of the clock signals is closer than the width of the transition pulse. When the alignment is bad, no signal will be produced.

In particular, said ANDed signal emerges from a small spike, grows to the width of the transition pulses, indicating perfect phase alignment, shrinks again to a small spike, and then disappears for a while before it emerges again in the same manner.

Thus, with the ANDed signal, a 'phase coincidence signal' is found which varies its characteristics with a frequency which is orders of magnitudes smaller than that of the clock signals and can thus be far easier evaluated. In the wording of the appended claims the evolution of said signal is characterized by a sequence of signatures varying in time (from no signal to small spike, larger spike, pulse having the width of the transition pulse, large spike, small spike, and again to no signal) which reflects the 'subsequent occurrence of the phase coincidence signal'.

Now, a broad variety of possibilities exist to evaluate said ANDed signal. Advantageously, only the begin and the end of time intervals must be determined to which a predetermined desired level of phase coincidence is existent or exceeded. Then, the center of said time interval can be chosen for the trigger time in which the hot-switching will be performed.

In a preferred embodiment of the present invention the above method is implemented with a simple phase detector logic and only two counters. The trigger time is determined by the occurrence of a counter overflow, generating a trigger signal which drives a select latch for switching from one clock to the other to an optimum point in time.

Thus, the present invention discloses a simple method and system for hot-switching between two clock signals which are simply to be realized without any larger efforts im programming logic and with small consumption of system resources. Finally, the proposed solution is a low cost solution.

The inventive concept is applicable to distributed systems having a central clock supply and to future systems having distributed clock sources, i.e. in the CECs where they are needed.

Instead of a clock signal, in general, other high frequency signals can be switched, too, (e.g. any relevant high frequency signal which is usable in a double form, one being an active, the other being a stand-by form).

BRIEF DESCRIPTION OF THE DRAWINGS

The present invention is next illustrated by way of example of a preferred embodiment of the inventive concept and is not limited by the shape of the figures of the accompanying drawings in which.

DETAILED DESCRIPTION OF THE INVENTION

Figure 1:
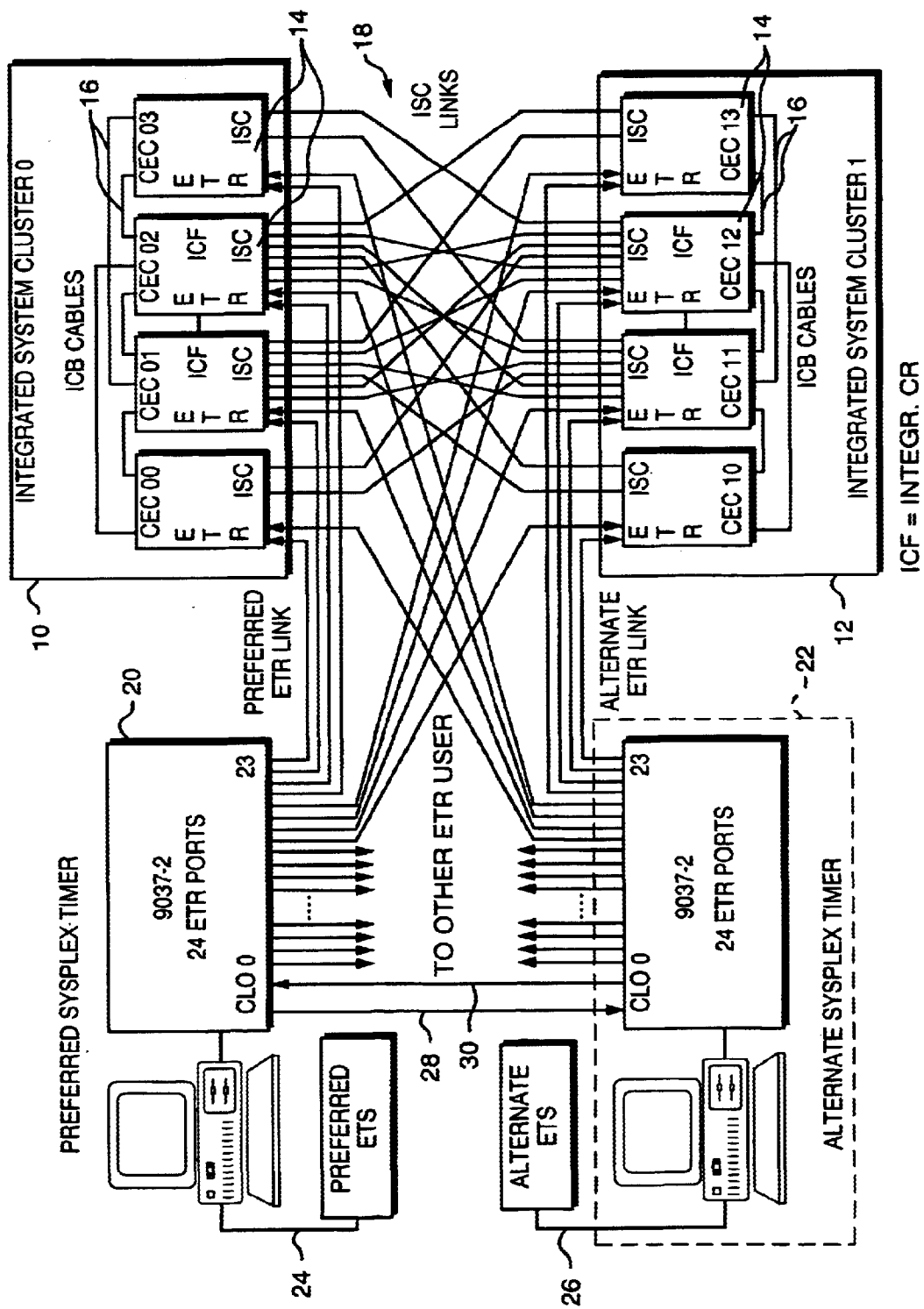
FIG. 1 is a schematic representation of two prior art inter-connected high-performance integrated system clusters having a big number of time information dedicated cables.

With general reference to the introductory part of the underlying description and with special reference how to FIG. 1 two prior art integrated system clusters 10, 12 are depicted each comprising amongst other four CECs 14 (00 . . . 03,10 . . . 13) interconnected via respective high speed data lines 16. Two Sysplex Timers, one preferred one 20, and one alternate one 22 are able to deliver time information to both clusters 10, 12 via respective time information transferring cables 18. The timers are each connected to the same absolute external time source ETS, like GPS or a caesium clock or the like, in order to read the correct absolute time with adequate accuracy. There are provided two Sysplex Timers for reasons of operation failure safety. The connection is managed by PC stations 24, 26, respectively. Further, the Sysplex Timers synchronize each other via two lines 28, 30. Further lines are depicted to other users of the external timing reference (ETR) which are not described explicitly.

To a given time only one of said time suppliers supplies the plurality of CECs with the time, i.e., clock information. Time information is synchronized between the two time sources with a dedicated time information line, again. On a failure in said 'active' time source the other, i.e., stand-by time source replaces the operation of the first.

Figure 2:
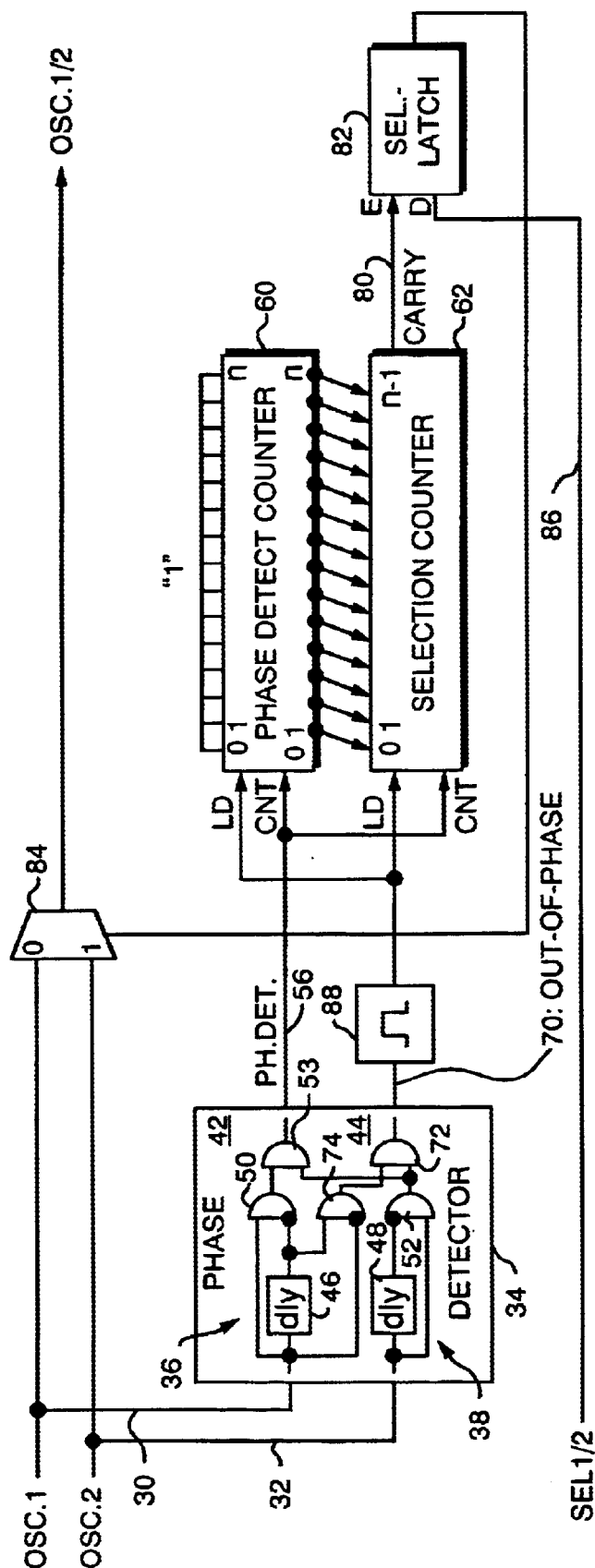
FIG. 2 is a schematic representation of the implementation of the precision oscillator selector unit on a clock chip of a clock supplier like a Sysplex Timer depicted in FIG. 1.

With reference now to FIG. 2 a preferred implementation of a circuit implementing the method according to the present invention will be described. The two oscillator clock signals are input via lines 30 and 32, respectively, into a phase detector 34. The phase detector inputs are each connected to a delay circuit 36, 38, respectively, in order to capture a pulse for each of the two oscillator clock signals. In particular, circuit 36 comprises in its upper branch an AND gate 50 where a pulse is captured at the positive transition of oscillator clock 1 signal, whereas in the branch comprising AND gate 74 a negative transition is captured. In the bottom circuit 38 in the branch including AND gate 52 a positive transition is captured.

The phase detector 34 has two outputs, a phase detection signal 42 and an 'out-of-phase' signal 44. The delay elements 46, 48 are of the same type and are positioned next to each other on the same chip in order to have identical physical properties as far as it is possible. The delayed signals are both inverted and are combined in a first and a second AND gate 50, 52, respectively. The output of said AND gates 50, 52 is combined in a third AND gate 53 which produces the 'phase detection' signal on a line 56. By using matched delay elements the widths of the two pulses is exactly the same. The absolute width, however, plays a minor role, only. It should be long enough to be able to produce a clear distinct pulse which is usable for the evaluation by the inventive method.

Figure 3:
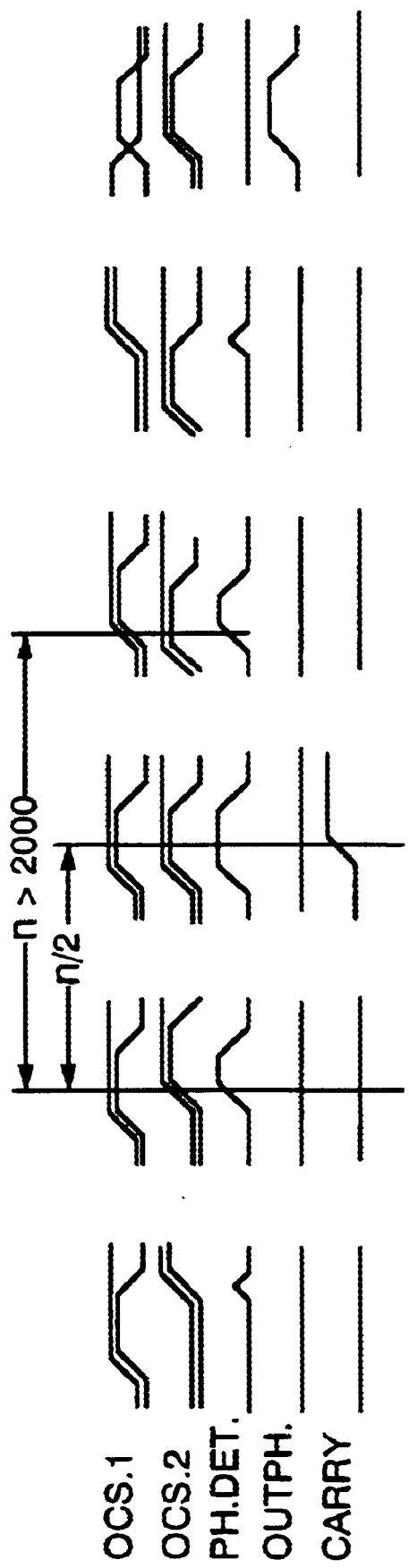
FIG. 3 is a schematic representation of some signals relevant during the inventive method.

With additional reference to FIG. 3 the two 'transition pulses' are indicated in the timing chart of FIG. 3 as thin lines, as it can be seen in the first and second signal row. Thick lines represent portions of the oscillator signals themselves.

When the phase alignment of the clock signals of oscillators 1, 2 is closer than the width of the transition pulses, the AND gate 53 generates pulses on said 'phase detection' signal line 56. During this process of signal evolution the 'phase detection' signal starts as a spike, grows to the width of the 'transition pulses' which corresponds to perfect phase alignment between the two oscillator signals, and then shrinks again to a spike. The longer the pulses are on said output line 56 the better is the phase alignment between oscillator clock signals 1 and 2.

Drawing the attention back to FIG. 2, said signal 56 is fed as input into a phase detect counter 60 and into a selection counter 62, both implemented as up-counters in this embodiment. The phase detect counter 60 counts all pulses of the phase detection signal and loads the inverted final count of each run into the selection counter 62 after dividing it by the factor of 2, i.e. by left shifting the binary value by one bit location, preferably at a time in which the both oscillator clocks are out of phase. In this way inactive periods of time can be used by the phase detect counter as there is nothing to be counted when the oscillator clock signals are not in-phase enough to be counted.

It should be noted that the counting process in the phase detection counter is triggered by the fact that there is a signal, i.e., a small spike is detected on line 56.

The determination of whether the two oscillator clocks are out of phase is made by the second output 70 of the phase detector 34. A signal on that output line is present when both oscillator clocks are out of phase. This can be achieved by a circuit, as illustrated in FIG. 2 by combining the output of the fourth AND gate 72 with a signal which was achieved by ANDing the inverted oscillator clock signal with the output of the first delay element 46 in an AND gate 74, as depicted in FIG. 2.

The 'out-of-phase' signal is generated by the phase detector 34 whenever the positive transition of oscillator 2 signal matches with the negative transition of oscillator 1 signal, in other words if both clock signals are out of phase and, in particular, if the phase difference is maximum.

With the help of an element 88 the first occurrence of said out of phase signal is used for further controlling the phase detection counter. This is described in more detail down below.

The phase detect counter 60 counts within a predetermined time window, i.e., the duration of phase overlapping of the two oscillator signals, until it has reached a maximum value which corresponds to the sum of pulses generated in one entire separate period of the phase detection signal on line 56. This maximum count can be 1000 for example. The counter can cover, however, a much wider range then 1000 only, since the period on the phase detection signal will be longer with lesser differences in frequency of the two clock signals. The maximum count is reached when the signal disappears on line 56 after having passed a cycle of evolution from small spike to wide edge pulse and back to small spike. Then, the maximum count is loaded into the selection counter 62 in an inverted form and left shifted by one bit location.

The selection counter 62 counting run is triggered by the same event as that one of the phase detect counter 60, i.e., occurrence of said small spike on line 56.

In this example, the selection counter is implemented as an up-counter. It counts up from the half of the minimum count obtained by inverting the maximum count in phase detect counter 60. Division by 2 is obtained by left-shifting said minimum (end) value passed from the phase detection counter 60. When the value of all bits being equal '1' is reached in the selection counter, this event corresponds to a time in which the phase detect counter 60 is exactly in the center of its current phase coincidence measurement cycle. Thus, a carry signal 80 is generated at the output of said selection counter 62 when the phase detect counter has yet detected a perfect phase alignment. In the underlying implementation the same type of counters can thus be taken for both counters 60, 62.

Next, the carry 80 is input into a select latch 82, the output of which is fed back to a switching element 84 which is dedicated to switch between oscillator signals 1 and 2 as described further down below.

In FIG. 3 the relevant signals are summarized in an overview, schematic representation. The vertical lines defining the interval of n>2000 pulses delimit the time interval(s) in which both oscillator clock signals overlap sufficiently. The vertical center line determines the trigger time at which the best phase coincidence is reached. At that trigger time the clock signals are switched. This act of switching is depicted in the last line in which the carry signal is depicted. Here, a pulse is generated to that exact point in time.

The fourth line in FIG. 3 shows the out-of-phase signal 44 which is normally zero, and which has a pulse when both clock signals are totally out of phase, see the right most pattern.

With special reference now to FIG. 4 the most essential elements of an exemplary control flow of the inventive method will be described next below. It should be noted that other embodiments of such a control flow can be established as well, thus solving the same task.

Figure 4:
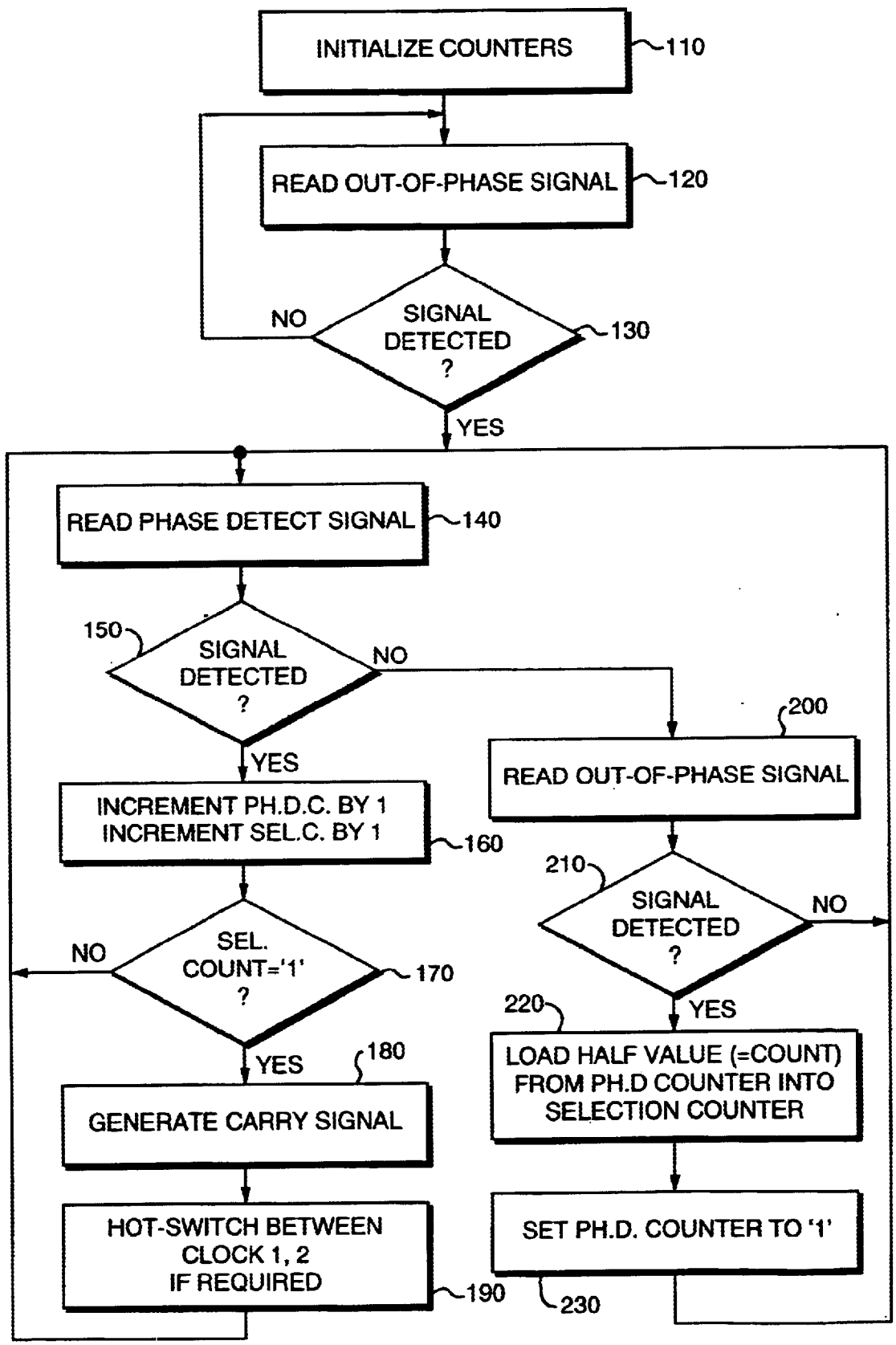
FIG. 4 is a schematic representation of the control flow of the inventive method showing its essential steps.

The control flow depicted in FIG. 4 could be part of a program which is enabled when hot-switching is required. Other kinds of embedding of the inventive method into the operating system functions are possible, too (e.g., a resident status like a watchdog, etc.).

In a step 110 both counters 60, 62 are initialized, the phase detection counter is advantageously set to a value of all bits being equal '1', in order to be incremented in the next step to its actual start value of '0'. The selection counter can be set to the inverted value, for example. Thus, both counters are ready to count up.

Then, before the regularly repeated program logic schema can start, an out-of-phase signal has to be detected in order to provide a proper start of the phase detection counter 60 with an entire cycle of the phase detection signal on line 56. Thus, said signal is steadily read, step 120. On detection, at decision box 130, the phase detect signal is read steadily, at step 140, in order to capture the emergence of the phase detect signal, specifically the small spike indicating the beginning of the evaluatable period of phase coincidence.

Upon detection, at step 150, both counters are incremented by 1, in step 160. Both counters count synchronously and are driven by the same signal pulse.

The foregoing processing is continued until a counter value of all bits being equal '1' is reached, as carry event in the selection counter. If the initializing value of the selection counter is the negative value having the absolute value of the half of the maximum value reached in the phase detection counter said carry event can be achieved in the first run of the counters. If implemented otherwise, the desired carry event of the selection counter will be expected in the second run. Many variations of initializing both counters and of obtaining the desired carry signal of the selection counter are easily to be derived by a person skilled in the art.

When this carry event or trigger event is reached, as determined at decision box 170, a carry signal is generated by the selection counter, at step 180 and is fed into input E of latch 82. When the polarity of a signal depicted as 'sell/2' in FIG. 2 has been changed by the controller via line 86 at the input D in a case in which a switch to the stand-by oscillator clock is desired, then the polarity of the latch 82 changes and the select latch can perform a hot-switching between the oscillator clock signals 1 and 2, at step 190, see FIG. 2. Thus, the aim of the method has been achieved.

Control is then fed back to step 140. Then, a sequence of loops between step 140 via decision box 150 exiting with 'No' and decision box 170 exiting with 'No' is expected until there is no more phase detect signal to be detected.

Then, decision box 150 is exited via the 'No' branch and the out-of-phase signal is read, step 200.

As long as this signal is not detected, the depicted logic loops, in the 'No' branch of decision 210 via step 140 and the 'No' branch of decision 150 and via step 200, to decision 210 again.

If the out-of-phase signal is detected, decision 210, the half value stored in phase detection counter which resulted from the last upward counting run of the phase detection counter is fed into the selection counter 62 after being inverted, step 220.

Then, the phase detection counter is set to all bits being equal '1', at step 230 and control is handed back over to step 140 in order to expect the next begin of time interval evaluable for determining the best phase coincidence between the two clock signals.

Therefore, a dedicated single-shot element 88 is connected between line 56 and line 70, respectively, as depicted in the drawing. Said element generates a pulse only at the first occurrence of a out-of-phase pulse and then blocks line 70. It reopens line 70 when the first phase-detected signal is received on line 56.

It should be noted that in the described implementation the selection counter counts up from a value which was 'measured' by the phase detect counter only one counter run, i.e., one period of the ANDed signal on line 56, before. Thus, the selection counter uses a 'measured' value which is actually not 'up-to-date' as it reflects the state of one period earlier in time, but a measured a value is used which is extremely close in time to the trigger value. This approach is thus very precise, since the resulting deviation is negligible.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

If the oscillator selector has to be designed for a synchronous logic, then a pulse shaper at each of the two outputs of the phase detector would be required. The pulse shapers synchronize the pulses 'phase detection' and out of phase with the logic clock.

It is obvious from the above description that many possibilities exist to modify the method according to the invention. As the auxiliary signal 'phase detection' has quite a large period compared to that one of the clock signals, said signal can be easily processed by conventional logic circuits. As said 'phase detection' signal is very stable referring to its periodic properties as the underlying oscillators generate in turn very stable oscillations, said properties can be used in a large variety of implementations in order to get a point of time, or a range of time in which the phase coincidence between the two clock signals are sufficient for the purpose of the underlying method.

Modifying the inventive method even the moment in which the pulse emerges on the signal line 'out of phase' could be evaluated, as one would just have to wait another half time of the cycle of the phase detection signal and this would yield the maximum point of phase coincidence.

What is claimed is:

1. A method for precisely switching between a first and a second high frequency signal, said second signal being a stand-by signal, comprising the steps of:

repeatedly comparing the phase information of both signals in a time window of predetermined length, by processing subsequent events, the events being defined by a subsequent occurrence of a phase coincidence signal derived from an operation which comprises an AND operation of both clock signals;

determining a first time interval during which said phase coincidence signal exceeds a predetermined threshold level;

establishing a time during said first time interval as a trigger time in which both signal phases are considered to be substantially in-phase for switching between said two signals; and switching from said first signal to said second signal using said trigger time.

2. The method according to claim 1, wherein said signals to be switched between are clocking signals of a computer system.

3. The method according to claim 1, wherein said step of processing said subsequent events comprises the steps of counting said subsequent events in a phase detection counter; and determining said trigger time with the help of two times associated with respective counts, a first time from which a begin of phase coincidence is derivable, and a second time from which an end of phase coincidence is derivable.

4. The method according to claim 3, wherein said trigger time is associated with the center of the first time interval defined by said first and second time.

5. The method according to claim 3, wherein said second time is determined by a signal produced by an overflow of a selection counter associated with said phase detection counter.

6. The method according to claim 5, wherein a count associable with an extreme value reached in the phase detection counter during a cycle of said phase coincidence signal is loaded as a starting value into the selection counter during a second time interval in which said two clock signals are not in-phase.

7. The method according to claim 6, wherein both counters are of the same type, and wherein said phase detection counter counts up to a maximum value and said selection counter counts up from a starting value being the inverted half of the maximum value until it reaches binary zero for producing an overflow and an associated carry signal.

8. A circuit usable for performing a.method for precisely switching between a first and a second high frequency signal, said second signal being a stand-by signal comprising:

comparator for repeatedly comparing the phase information of both signals in a time window of predetermined length;

a processor for processing subsequent events, the events being defined by a subsequent occurrence of a phase coincidence signal derived from an operation including an AND operation of both clock signals;

a time interval component for determining a time interval during which said phase coincidence exceeds a predetermined threshold level and for establishing a time during said time interval as a trigger time in which both signal phases are considered as in-phase enough for switching between said two signals; and a switching component for switching from said first signal to said second signal using said trigger time.

9. The circuit according to claim 8, wherein said switching component is provided to switch between clock signals of a computer system.

10. The circuit according to claim 8, wherein said processor for processing said subsequent events comprises a first counter for counting said subsequent events, and wherein said comparator for repeatedly comparing said signals comprise two matched delay elements for processing said both signals in conjunction with said AND operation.

11. The circuit according to claim 10, wherein a second counter is provided coupled to said first counter.

12. The circuit according to claim 11, wherein said first and said second counters are of the same type.

13. A computer system comprising an oscillator card comprising a circuit usable for performing a method for precisely switching between a first and a second high frequency signal, said second signal being a stand-by signal, said circuit comprising:

comparator for repeatedly comparing the phase information of both signals in a time window of predetermined length;

a processor for processing subsequent events, the events being defined by a subsequent occurrence of a phase coincidence signal derived from an operation including an AND operation of both clock signals;

a time interval component for determining a time interval during which said phase coincidence exceeds a predetermined threshold level and for establishing a time during said time interval as a trigger time in which both signal phases are considered as in-phase enough for switching between said two signals; and a switching component for switching from said first signal to said second signal using said trigger time.

14. A computer system adapted to perform the method for precisely switching between a first and a second high frequency signal, said second signal being a stand-by signal, comprising the steps of:

repeatedly comparing the phase information of both signals in a time window of predetermined length, by processing subsequent events, the events being defined by a subsequent occurrence of a phase coincidence signal derived from an operation which comprises an AND operation of both clock signals;

determining a first time interval during which said phase coincidence signal exceeds a predetermined threshold level;

establishing a time during said first time interval as a trigger time in which both signal phases are considered to be substantially in-phase for switching between said two signals; and switching from said first signal to said second signal using said trigger time.

15. An oscillator card comprising at least a part of a circuit usable for performing a method for precisely switching between a first and a second high frequency signal, said second signal being a stand-by signal, said circuit comprising:

comparator for repeatedly comparing the phase information of both signals in a time window of predetermined length;

a processor for processing subsequent events, the events being defined by a subsequent occurrence of a phase coincidence signal derived from an operation including an AND operation of both clock signals;

a time interval component for determining a time interval during which said phase coincidence exceeds a predetermined threshold level and for establishing a time during said time interval as a trigger time in which both signal phases are considered as in-phase enough for switching between said two signals; and a switching component for switching from said first signal to said second signal using said trigger time.

* * * * *